(12) United States Patent
Tan et al.

(10) Patent No.: US 8,854,753 B2
(45) Date of Patent: Oct. 7, 2014

(54) SYSTEMS AND METHODS FOR AUTO SCALING IN A DATA PROCESSING SYSTEM

(75) Inventors: Weijun Tan, Longmont, CO (US); Hongwei Song, Longmont, CO (US); Kelly Fitzpatrick, Sudbury, MA (US)

(73) Assignee: LSI Corporation, San Jose, CA (US)

( * ) Notice: Subject to any disclaimer, the term of this patent is extended or adjusted under 35 U.S.C. 154(b) by 554 days.

(21) Appl. No.: 13/050,129

(22) Filed: Mar. 17, 2011

(65) Prior Publication Data

US 2012/0236430 A1    Sep. 20, 2012

(51) Int. Cl.
*G11B 5/09* (2006.01)
*G11B 20/10* (2006.01)
*H03M 13/00* (2006.01)
*H03M 13/11* (2006.01)

(52) U.S. Cl.
CPC .... *G11B 20/10379* (2013.01); *G11B 20/10472* (2013.01); *H03M 13/6343* (2013.01); *G11B 20/10314* (2013.01); *H03M 13/6331* (2013.01); *G11B 2220/2516* (2013.01); *H03M 13/1111* (2013.01); *H03M 13/658* (2013.01)
USPC ............ 360/39; 360/25; 714/794; 714/795; 714/796

(58) Field of Classification Search
None
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,317,472 A | 5/1994 | Schweitzer, III |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,118 A | 9/1998 | Bliss et al. |
| 5,844,945 A | 12/1998 | Nam et al. |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Dismery Mercedes
(74) *Attorney, Agent, or Firm* — Hamilton DeSanctis & Cha

(57) ABSTRACT

Various embodiments of the present invention provide systems and methods for data processing. As an example, a data processing circuit having a data detection circuit is disclosed that includes: a scaling circuit, a soft output calculation circuit, and a factor calculation circuit. The scaling circuit is operable to scale a branch metric value by a scaling factor to yield a scaled output. The soft output calculation circuit is operable to calculate a soft output based at least in part on the scaled output. The factor calculation circuit operable to modify the scaling factor based at least in part on the soft output.

20 Claims, 5 Drawing Sheets

(56) References Cited

U.S. PATENT DOCUMENTS

| | | | |
|---|---|---|---|
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,393,076 B1 * | 5/2002 | Dinc et al. | 375/341 |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Katawani et al. | |
| 6,748,034 B2 | 6/2004 | Hattori et al. | |
| 6,757,862 B1 | 6/2004 | Marianetti, II | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greeberg et al. | |
| 7,093,179 B2 | 8/2006 | Shea | |
| 7,113,356 B1 | 9/2006 | Wu | |
| 7,136,244 B1 | 11/2006 | Rothbert | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghaven et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghaven et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,589,372 B2 | 9/2009 | Shin et al. | |
| 7,590,168 B2 | 9/2009 | Raghaven et al. | |
| 7,702,989 B2 | 4/2010 | Graef et al. | |
| 7,712,008 B2 | 5/2010 | Song et al. | |
| 7,738,201 B2 | 6/2010 | Jin et al. | |
| 7,752,523 B1 | 7/2010 | Chaichanavong | |
| 7,801,200 B2 | 9/2010 | Tan | |
| 7,802,163 B2 | 9/2010 | Tan | |
| 8,149,527 B2 * | 4/2012 | Tan et al. | 360/25 |
| 8,296,638 B2 * | 10/2012 | Derras | 714/795 |
| 8,683,306 B2 * | 3/2014 | Yang et al. | 714/796 |
| 2003/0063405 A1 | 4/2003 | Jin et al. | |
| 2003/0081693 A1 | 5/2003 | Raghaven et al. | |
| 2003/0087634 A1 | 5/2003 | Raghaven et al. | |
| 2003/0112896 A1 | 6/2003 | Raghaven et al. | |
| 2003/0134607 A1 | 7/2003 | Raghaven et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0025076 A1 * | 2/2005 | Chaudhuri et al. | 370/310 |
| 2005/0078399 A1 | 4/2005 | Fung | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0210002 A1 | 9/2006 | Yang et al. | |
| 2006/0227903 A1 * | 10/2006 | Niu et al. | 375/340 |
| 2006/0248484 A1 | 11/2006 | Haratsch | |
| 2006/0256670 A1 | 11/2006 | Park et al. | |
| 2007/0011569 A1 | 1/2007 | Casado et al. | |
| 2007/0047121 A1 | 3/2007 | Elefeheriou et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0234178 A1 * | 10/2007 | Richardson et al. | 714/758 |
| 2007/0286270 A1 | 12/2007 | Huang et al. | |
| 2007/0297496 A1 * | 12/2007 | Park et al. | 375/148 |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0104486 A1 * | 5/2008 | Kanaoka | 714/780 |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0185643 A1 | 7/2009 | Fitzpatrick | |
| 2009/0199071 A1 | 8/2009 | Graef | |
| 2009/0235116 A1 | 9/2009 | Tan et al. | |
| 2009/0235146 A1 * | 9/2009 | Tan et al. | 714/780 |
| 2009/0259915 A1 | 10/2009 | Livshitz et al. | |
| 2009/0268575 A1 * | 10/2009 | Tan et al. | 369/53.41 |
| 2009/0273492 A1 | 11/2009 | Yang et al. | |
| 2009/0274247 A1 | 11/2009 | Galbraith et al. | |
| 2010/0002795 A1 | 1/2010 | Raghaven et al. | |
| 2010/0042877 A1 * | 2/2010 | Tan | 714/704 |
| 2010/0042890 A1 | 2/2010 | Gunam | |
| 2010/0050043 A1 | 2/2010 | Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2010/0269023 A1 * | 10/2010 | Yang et al. | 714/769 |
| 2011/0075569 A1 | 3/2011 | Marrow et al. | |
| 2011/0080211 A1 | 4/2011 | Yang et al. | |
| 2011/0167246 A1 | 7/2011 | Yang et al. | |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | 2010/101578 | 9/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu et al.
U.S. Appl. No. 12/652,201, Jan. 5, 2010, Mathew et al.
U.S. Appl. No. 12/763,050, filed Apr. 19, 2010, Ivkovic et al.
U.S. Appl. No. 12/792,555, filed Jun. 2, 2010, Liu et al.
U.S. Appl. No. 12/887,317, filed Sep. 21, 2010, Xia et al.
U.S. Appl. No. 12/887,330, filed Sep. 21, 2010, Zhang et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/901,742, filed Oct. 11, 2010, Yang.
U.S. Appl. No. 12/917,756, filed Nov. 2, 2010, Miladinovic et al.

(56) References Cited

OTHER PUBLICATIONS

U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
U.S. Appl. No. 12/992,948, filed Nov. 16, 2010, Yang et al.
U.S. Appl. No. 13/021,814, filed Feb. 7, 2011, Jin, Ming et al.
U.S. Appl. No. 13/031,818, filed Feb. 22, 2011, Xu, Changyou et al.
U.S. Appl. No. 13/050,129, filed Mar. 17, 2011, Tan et al.
U.S. Appl. No. 13/050,765, filed Mar. 17, 2011, Yang et al.
U.S. Appl. No. 13/088,119, filed Apr. 15, 2011, Zhang et al.
U.S. Appl. No. 13/088,146, filed Apr. 15, 2011, Li et al.
U.S. Appl. No. 13/088,178, filed Apr. 15, 2011, Sun et al.
U.S. Appl. No. 13/126,748, filed Apr. 28, 2011, Tan.
U.S. Appl. No. 13/167,764, filed Jun. 24, 2011, Li, Zongwang et al.
U.S. Appl. No. 13/167,771, filed Jun. 24, 2011, Li, Zongwang et al.
U.S. Appl. No. 13/167,775, filed Jun. 24, 2011, Li, Zongwang.
U.S. Appl. No. 13/186,146, filed Jul. 19, 2011, Mathew et al.
U.S. Appl. No. 13/186,213, filed Jul. 19, 2011, Mathew et al.
U.S. Appl. No. 13/186,234, filed Jul. 19, 2011, Xia, Haitao et al.
U.S. Appl. No. 13/186,251, filed Jul. 19, 2011, Haitao et al.
U.S. Appl. No. 13/186,174, filed Jul. 19, 2011, Mathew et al.
U.S. Appl. No. 13/186,197, filed Jul. 19, 2011, Mathew, George et al.
U.S. Appl. No. 13/213,751, filed Aug. 19, 2011, Zhang, Fan et al.
U.S. Appl. No. 13/213,808, filed Aug. 19, 2011, Jin, Ming.
U.S. Appl. No. 13/220,142, filed Aug. 29, 2011, Chang, Wu et al.
U.S. Appl. No. 13/227,538, filed Sep. 8, 2011, Yang, Shaohua et al.
U.S. Appl. No. 13/227,544, filed Sep. 8, 2011, Yang, Shaohua et al.
U.S. Appl. No. 13/239,683, filed Sep. 22, 2011, Xu, Changyou.
U.S. Appl. No. 13/239,719, filed Sep. 22, 2011, Xia, Haitao et al.
U.S. Appl. No. 13/251,342, filed Oct. 2, 2011, Xia, Haitao et al.
U.S. Appl. No. 13/269,832, filed Oct. 10, 2011, Xia, Haitao et al.
U.S. Appl. No. 13/269,852, filed Oct. 10, 2011, Xia, Haitao et al.
U.S. Appl. No. 13/284,819, filed Oct. 28, 2011, Tan, Weijun et al.
U.S. Appl. No. 13/284,730, filed Oct. 28, 2011, Zhang, Fan et al.
U.S. Appl. No. 13/284,754, filed Oct. 28, 2011, Zhang, Fan et al.
U.S. Appl. No. 13/284,767, filed Oct. 28, 2011, Zhang, Fan et al.
U.S. Appl. No. 13/284,826, filed Oct. 28, 2011, Tan, Weijun et al.
U.S. Appl. No. 13/295,150, filed Nov. 14, 2011, Li, Zongwang et al.
U.S. Appl. No. 13/295,160, filed Nov. 14, 2011, Li, Zongwang et al.
U.S. Appl. No. 13/251,340, filed Oct. 3, 2011, Xia, Haitao et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low- denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks, Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels " IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.-

(56) References Cited

OTHER PUBLICATIONS

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR AUTO SCALING IN A DATA PROCESSING SYSTEM

BACKGROUND OF THE INVENTION

The present inventions are related to systems and methods for detecting and/or decoding information, and more particularly to systems and methods for performing auto scaling in a data processing system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream. In some cases, guidance information developed between data detection processes and data decoding processes saturate. As such, it is difficult to use the information in a meaningful way that will lead to data convergence.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing auto scaling in a data processing system.

Various embodiments of the present invention provide data processing circuits having a data detection circuit. The data detection circuit includes: a scaling circuit, a soft output calculation circuit, and a factor calculation circuit. The scaling circuit is operable to scale a branch metric value by a scaling factor to yield a scaled output. The soft output calculation circuit is operable to calculate a soft output based at least in part on the scaled output. The factor calculation circuit operable to modify the scaling factor based at least in part on the soft output.

In some instances of the aforementioned embodiments, the scaling factor is a first scaling factor, and the data processing circuit further includes: a soft output scaling circuit, and a data decoding circuit. The soft output scaling circuit is operable to scale the soft output by a second scaling factor to yield a scaled soft output. The data decoding circuit is operable to apply a data decoding algorithm to the scaled soft output to yield a decoded output. In some such instances, the data decoding circuit is a low density parity check circuit. In various instances of the aforementioned embodiments, the data processing circuit further includes a decoded output scaling circuit operable to scale the decoded output by a third scaling factor to yield a scaled decoded output. In some such cases, the third scaling factor is the inverse of the second scaling factor. In some such cases, the data processing circuit further includes an auto scalar calculation circuit that is operable to calculate the third scaling factor.

In various instances of the aforementioned embodiments, the scaling circuit is a multiplier circuit that is operable to multiply the branch metric value by the scaling factor to yield the scaled output. In some instances of the aforementioned embodiments, the factor calculation circuit includes a scalar calculation circuit operable to calculate an absolute of a mean value including at least one instance of the soft output to yield a precursor value. In some such instances, the factor calculation circuit further includes a comparator circuit operable to compare the precursor value against a threshold value, and to increment the scaling factor where the precursor factor is less than the threshold value. In other such instances, the factor calculation circuit further includes a comparator circuit operable to compare the precursor value against a threshold value, and to decrement the scaling factor where the precursor factor is greater than the threshold value. In one or more of such instances, the factor calculation circuit further includes a selector circuit operable to select the scaling factor as one of a default scaling factor and a scaling factor based at least in part on the precursor value.

Other embodiments of the present invention provide methods for auto-scaling intrinsic processing values. The methods include performing a data detection on a data input to yield a detected output. The data detection yields a first interim value and a second interim value. The methods further include: combining at least the first interim value and the second interim value to yield a precursor value; comparing the precursor value with a threshold value to yield a comparison result; modifying a scaling factor based at least in part on the comparison result; scaling the first interim value by the scaling factor to yield a scaled interim value; and generating a soft output corresponding to the scaled interim value. The soft output is include in the detected output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for performing auto scaling in a data processing system.

Figure 1:
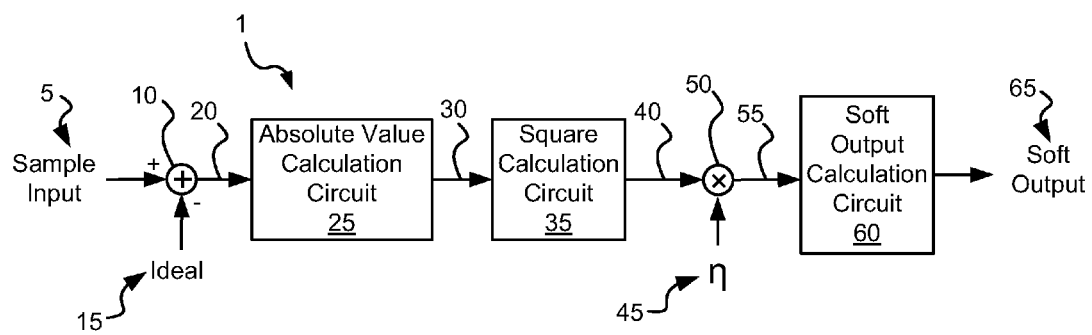
FIG. 1 depicts a prior art data detector circuit.

Turning to FIG. 1, a prior art data detector circuit 1 is depicted. Data detector circuit 1 includes a summation circuit 10 that subtracts an ideal value 15 from a sample input 5 to yield a noise value 20. An absolute value 30 of noise value 20 is calculated by an absolute value calculation circuit 25, and absolute value 30 is squared by a square calculation circuit 35 to yield a squared value 40. Squared value 40 is multiplied by a data detector scaling factor ($\eta$) 45 to yield a scaled branch metric 55. Scaled branch metric 55 is provided to a soft output calculation circuit 60 that calculates a soft output 65 (e.g., a log likelihood ratio).

Figure 2:
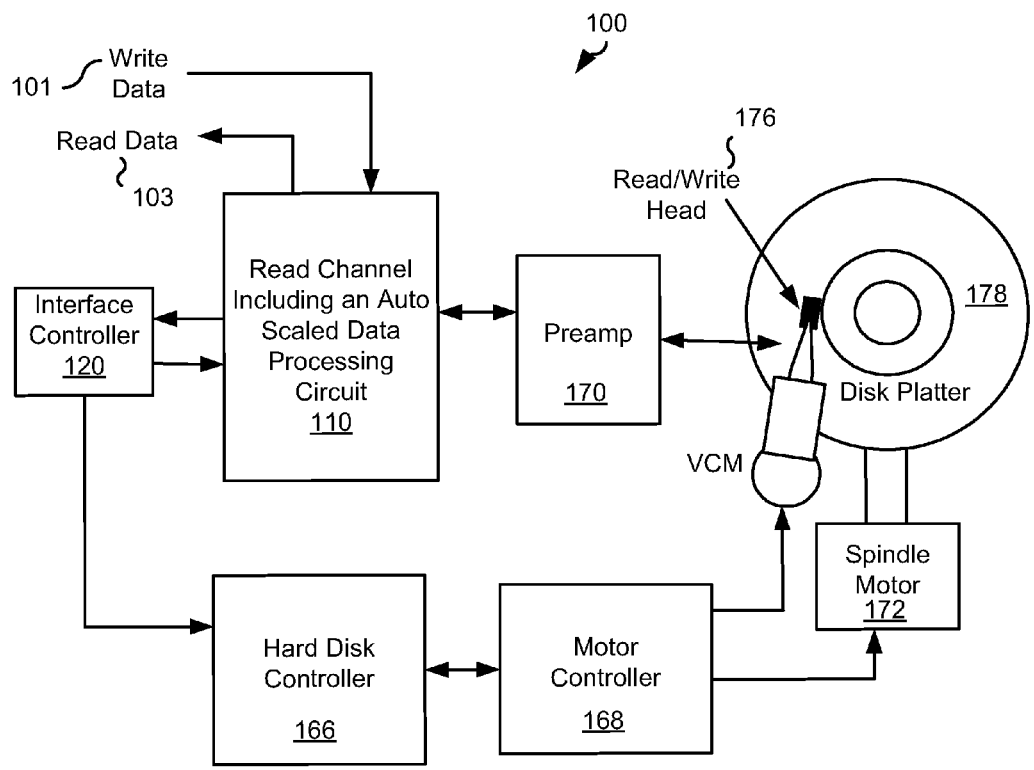
FIG. 2 shows a storage system including a read channel with an auto-scaled data processing circuit in accordance with one or more embodiments of the present invention.

Turning to FIG. 2, a storage system 100 including a read channel circuit 110 with an auto-scaled data processing circuit in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. As part of processing the received information, read channel circuit 110 performs an auto-scaled data processing. Such an auto-scaled data processing may operate similar to the method described in relation to FIG. 7 below, and/or may use data processing circuitry similar to that discussed in relation to FIG. 4 below. A write operation is substantially the opposite of the preceding read operation with write data 101 being provided to read channel circuit 110. This data is then encoded and written to disk platter 178.

It should be noted that storage system 100 may be integrated into a larger storage system such as, for example, a RAID (redundant array of inexpensive disks or redundant array of independent disks) based storage system. It should also be noted that various functions or blocks of storage system 100 may be implemented in either software or firmware, while other functions or blocks are implemented in hardware.

Figure 3:
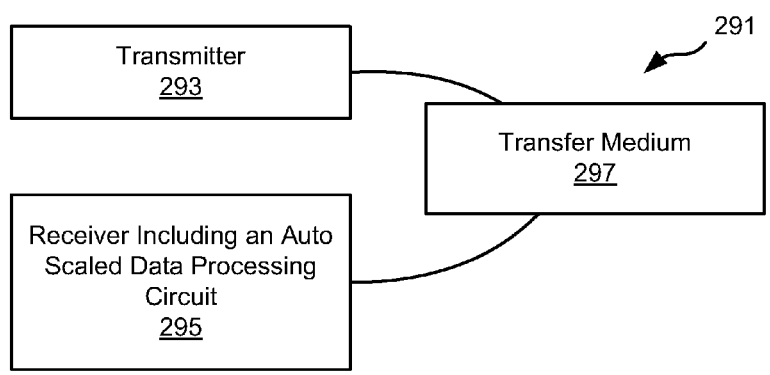
FIG. 3 depicts a data transmission system including a receiver with an auto-scaled data processing circuit in accordance with one or more embodiments of the present invention.

Turning to FIG. 3, a data transmission system 200 is depicted that includes a receiver 295 with an auto-scaled data processing circuit in accordance with one or more embodiments of the present invention. Data transmission system 200 includes a transmitter 293 that is operable to transmit encoded information via a transfer medium 297 as is known in the art. The encoded data is received from transfer medium 297 by receiver 295. Receiver 295 incorporates an auto-scaled data processing circuit. Such auto-scaled data processing may operate similar to the method described in relation to FIG. 7 below, and/or may use data processing circuitry similar to that discussed in relation to FIG. 4 or FIG. 6 below.

Figure 4:
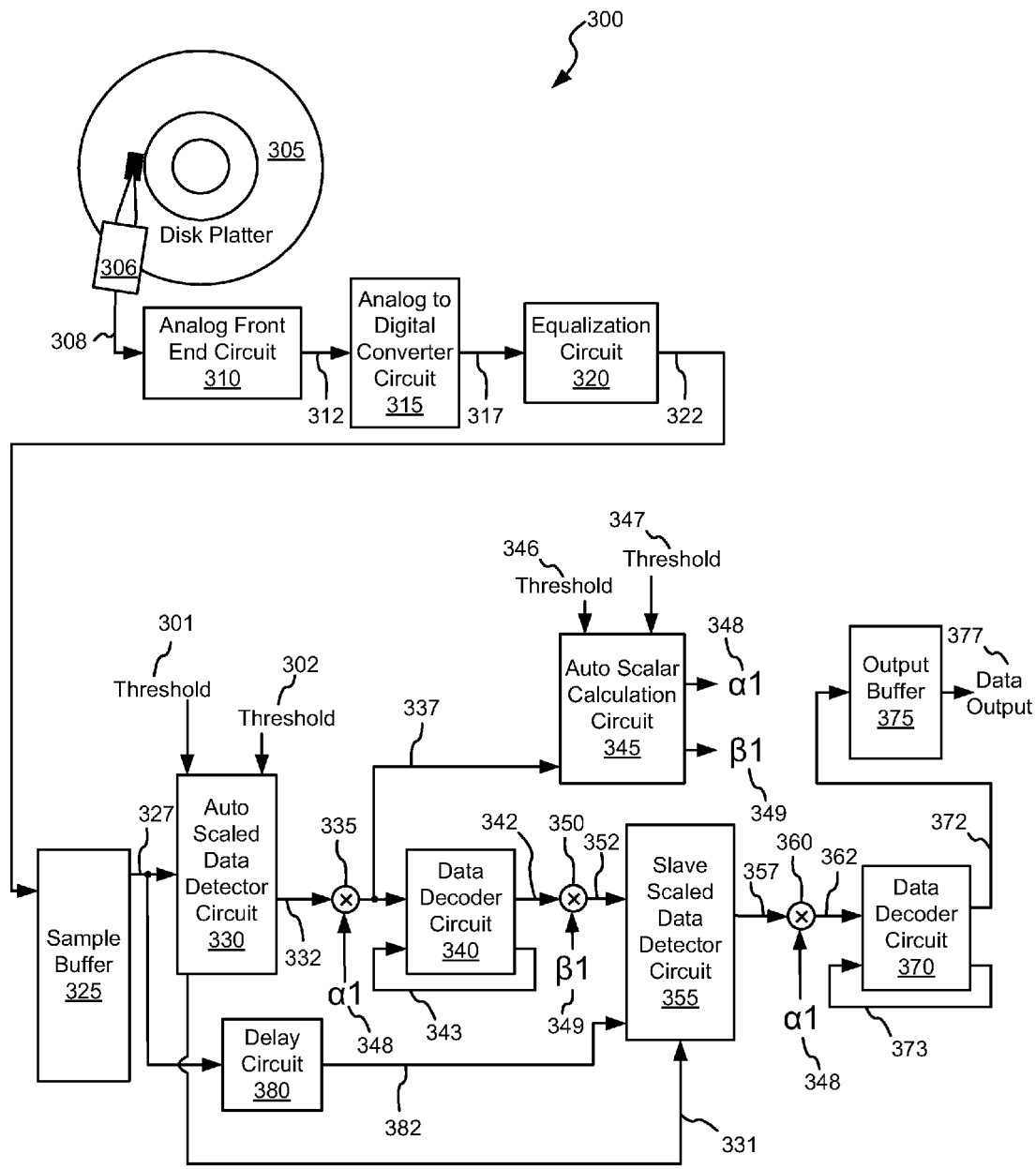
FIG. 4 shows a data processing circuit including auto-scaling in accordance with one or more embodiments of the present invention.

Turning to FIG. 4, a data processing circuit 300 including auto-scaling is shown in accordance with one or more embodiments of the present invention. Data processing circuit 300 includes an analog front end circuit 310 that receives an analog signal 308 from a read/write head assembly 306 disposed in relation to a disk platter 305. Disk platter 305 stores information that may be sensed by read/write head assembly 306. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalization circuit 320 that equalizes the received samples and provides a corresponding equalized output 322. In some embodiments of the present invention, equalization circuit 320 is implemented using digital finite impulse response filter as are known in the art.

Equalized output 322 is stored to a sample buffer 325. The data is provided from the sample buffer to a series of data detector circuits and data decoder circuits that provide for multiple pass processing of a received data input. In particular, a buffered output 327 is provided to an auto scaled data detector circuit 330. Auto scaled data detector circuit 330 may be any data detection circuit including auto-scaling in accordance with one or more embodiments of the present invention. For example, in one particular embodiment of the present invention, auto-scaled data detector circuit 330 is a maximum a posteriori (MAP) detector modified to apply auto-scaling. Auto-scaled data detector circuit 330 performs a data detection process on buffered output 327 and provides a detected output 332. The scaling applied by auto-scaled data detector circuit 330 operates to cause detected output 332 to, on average, be maintained in a range defined as between an upper threshold 301 and a lower threshold 302. In some embodiments of the present invention, auto-scaled data detector circuit 330 is implemented similar to the circuit discussed below in relation to FIG. 5. Auto-scaled data detector circuit 330 calculates an internal scaling value (η) that is both used by auto-scaled detector circuit 330 and provided as a scalar output 331 to one or more downstream slave data detectors (e.g., slave scaled data detector circuit 355).

Detected output 332 is multiplied by a trained scaling factor 348 (α1) using a multiplier circuit 335. A product output 337 from multiplier circuit 335 is provided to a decoder circuit 340. Decoder circuit 340 may be any circuit capable of applying a decoding algorithm to a received input. In some particular embodiments of the present invention, decoder circuit 340 is a low density parity check (LDPC) decoder circuit as are known in the art. Based upon the disclosure provided herein, one of ordinary skill in the art will recognize a variety of decoder circuits that may be used in relation to different embodiments of the present invention. Trained scaling factor 348 is calculated by an auto scalar calculation circuit 345 as discussed below. Trained scaling factor 348 is designed to scale detected output 332 to maintain the operation of decoder circuit 340 in an unsaturated region. Data decoder circuit 340 may perform multiple local iterations as indicated by a feedback 343 to yield a decoded output 342.

Decoded output 342 is multiplied by a trained scaling factor 349 (β1) using a multiplier circuit 350. A product output 352 from multiplier circuit 350 is provided to a slave scaled data detector circuit 355 that uses buffered output 327 delayed through a delay circuit 380 to align a delayed output 382 in time with product output 352. Slave scaled data detector circuit 355 may be any data detection circuit including an internal scaling capability. For example, in one particular embodiment of the present invention, slave scaled data detector circuit 355 is a maximum a posteriori (MAP) detector modified to apply slave scaling. Slave scaled data detector circuit 355 performs a data detection process on product output 352 and provides a detected output 357. The scaling applied by slave scaled data detector circuit 355 operates to cause detected output 357 to, on average, be maintained in a range defined as between an upper threshold 301 and a lower threshold 302. In some embodiments of the present invention, slave scaled data detector circuit 355 is implemented similar to the circuit discussed above in relation to FIG. 1.

Detected output 357 is multiplied by trained scaling factor 348 (α1) using a multiplier circuit 360. A product output 362 from multiplier circuit 360 is provided to a decoder circuit 370. Decoder circuit 370 may be any circuit capable of applying a decoding algorithm to a received input. In some particular embodiments of the present invention, decoder circuit 370 is a low density parity check (LDPC) decoder circuit as are known in the art. Based upon the disclosure provided herein, one of ordinary skill in the art will recognize a variety of decoder circuits that may be used in relation to different embodiments of the present invention. Data decoder circuit 370 may perform multiple local iterations as indicated by a feedback 373 to yield a decoded output 372.

Scaling factor 349 and scaling factor 348 are both auto calculated (i.e., trained) by auto scalar calculation circuit 345 based upon product output 337. Scaling factor 348 is calculated to scale product output 337 to maintain the operation of decoder circuit 340 within a desired range. Scaling factor 349 is the inverse of scaling factor 348. In particular, auto scalar calculation circuit 345 receives product output 337, calculates an absolute value of product output 337, calculates a mean of the absolute values of product output 337, and compares the mean against a threshold value 346 and another threshold value 347. In some embodiments, both threshold value 346 and threshold value 347 are programmable. The values of scaling factor 348 and scaling factor 349 are updated if either the absolute value of the mean of product output 337 is less than threshold value 346 or if the absolute value of the mean is greater than threshold 347. The following pseudocode describes the update condition:

If (mean (|product output 337|$_i$) < threshold 346 || mean (|product output 337|$_i$) > threshold 347)
{
    Update Scaling Factors
}
Else {
    Maintain Scaling Factors
}

Scaling factor 348 and scaling factor 349 are updated to assure that a mean of product output 337 is maintained in a desired range controlled by threshold value 346 and threshold value 347. Such updating may include, but is not limited to, selecting a next higher or a next lower scaling factor based on the aforementioned comparison. Decoded output 372 is provided to an output buffer 375 where it is prepared for providing as a data output 377.

It should be noted that use of auto-scaled data detector circuits in accordance with various embodiments of the present invention may be applied to different data processing circuit architectures. As examples, such auto-scaled data detector circuits may be applied to a serial architecture such as that discussed in relation to FIG. 4 herein, or may be applied to iterative architectures as discussed in relation to FIGS. 3a-3b of PCT Patent App. No. PCT/US09/41867 entitled "Systems and Methods for Dynamic Scaling in a Read Data Processing System", and filed Apr. 28, 2009 by Yang et al. The entirety of the aforementioned reference is incorporated herein by reference for all purposes. Based upon the disclosure provided herein, one of ordinary skill in the art will recognize other architectures into which an auto-scaled data detector circuit may be placed in accordance with different embodiments of the present invention.

Figure 5:
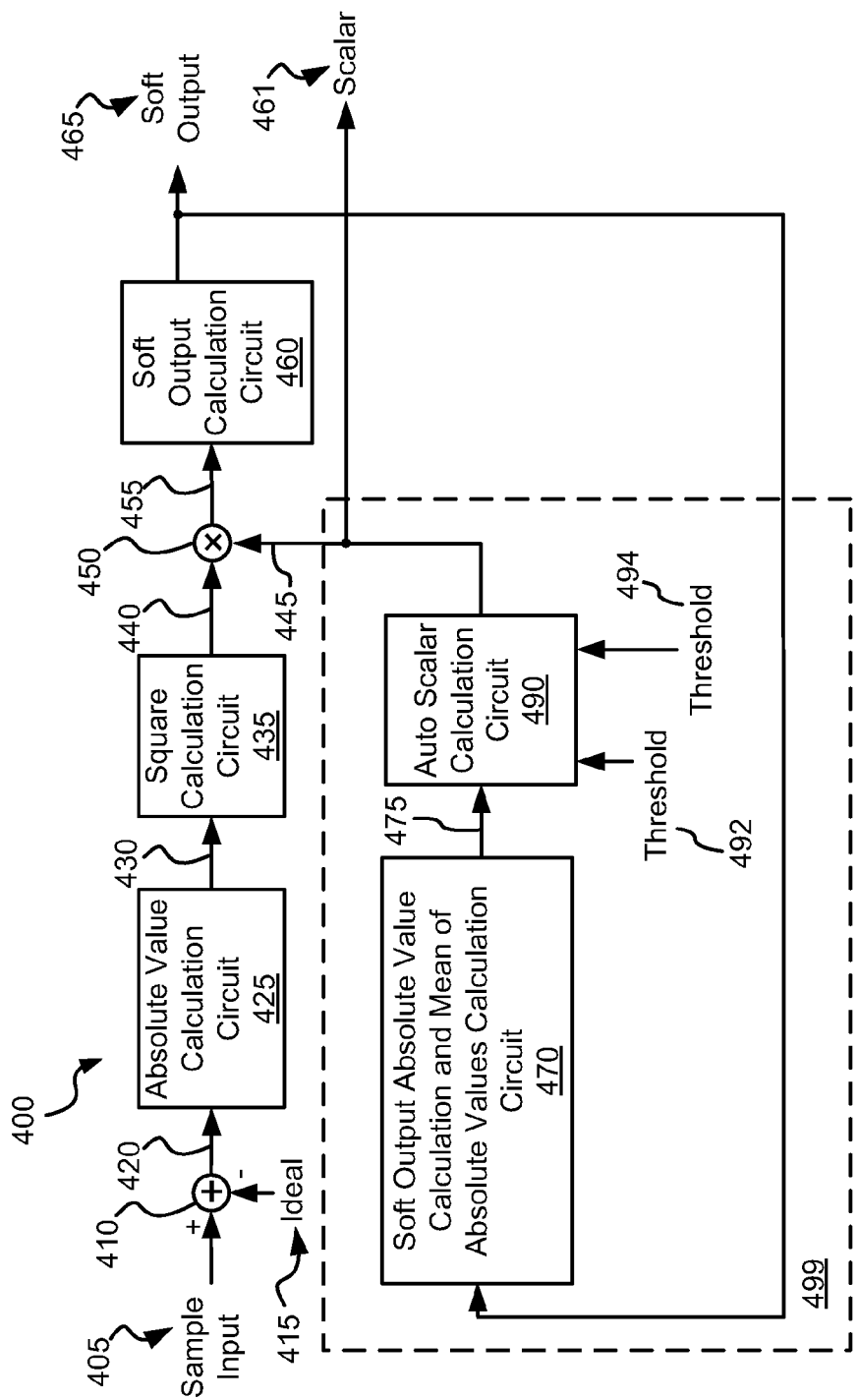
FIG. 5 depicts a data detector circuit including an auto scaling capability in accordance with some embodiments of the present invention.

Turning to FIG. 5, a data detector circuit 400 is shown that includes auto scaling capability in accordance with some embodiments of the present invention. Data detector circuit 400 includes a summation circuit 410 that subtracts an ideal value 415 from a sample input 405 to yield a noise value 420. An absolute value 430 of noise value 420 is calculated by an absolute value calculation circuit 425, and absolute value 430 is squared by a square calculation circuit 435 to yield a squared value 440 in accordance with the following equation:

Squared Value 440=[abs(Sample Input 405−Ideal 415)]$^2$.

Squared value 440 is multiplied using a multiplier circuit 450 by a data detector scaling factor 445 to yield a scaled branch metric (e.g., an intrinsic branch metric) 455. Scaled branch metric 455 is provided to a soft output calculation circuit 460 that calculates a soft output 465 (e.g., a log likelihood ratio). Soft output calculation circuit 465 may be any circuit known in the art that is capable of providing a soft output value based upon an input branch metric value. Data detector scaling factor 445 is also provided as a scalar output (η) 461 for use in downstream slave scaled data detector circuits (not shown).

Data detector scaling factor 445 is variable depending upon the value of soft output 465 as controlled by a variable factor calculation circuit 499 (outlined by a dashed line). In particular, a soft output absolute value calculation and mean of the absolute value calculation circuit 470 averages the absolute value of a number of instances of soft output 465 to yield a mean value 475. In some cases, the number of instances of soft output 465 combined in mean 475 is several thousand. In some cases, a running average is maintained. Mean 475 is provided to an auto scalar calculation circuit 490 where it is compared against an upper threshold 492 and a lower threshold 494 to determine if it is within a desired range. Where mean 475 is above upper threshold 492 data detector scaling factor 445 is reduced to a next lower value (e.g., η equal to ½, ¼, ⅛, or ¹⁄₁₆) resulting in a decrease in subsequent instances of soft output 465. Alternatively, where mean 475 is consistently less than lower threshold 494, data detector scaling factor 445 is changed to the next higher value (e.g., η equal to ½, ¼, ⅛, or ¹⁄₁₆) resulting in an increase in subsequent instances of soft output 465. In some cases, upper threshold 492 and lower threshold 494 are programmable.

The following pseudo-code describes the operation of variable factor calculation circuit 499 consistent with the discussion above:

```
Data Detector Scaling Factor 486 = Midrange Value;
For (i=1 to n)
{
    Sum = [absolute_value(Soft Output 465)]_i
}
Mean 475 = Sum/n;
If (abs[Mean 475] > Upper Threshold 492)
{
    Data Detector Scaling Factor 483 = Next Lower Value
}
Else If (abs[Mean 475] < Lower Threshold 494)
{
    Data Detector Scaling Factor 483 = Next Higher Value
}
    Data Detector Scaling Factor 445 = Data Detector Scaling Factor 483
```

Figure 6:
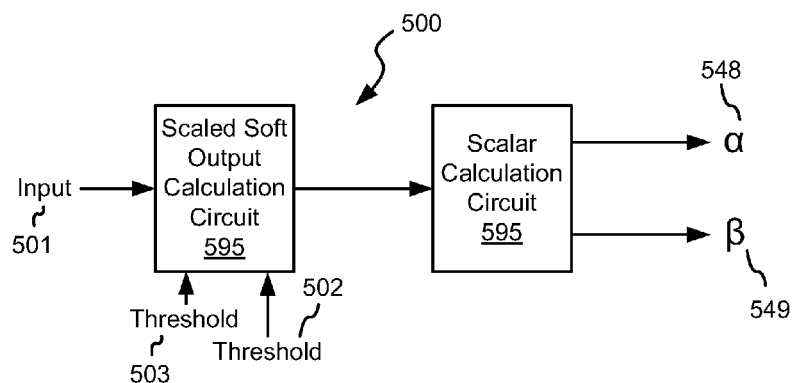
FIG. 6 depicts one implementation of an auto scalar calculation circuit that may be used in relation to the data processing circuits of FIG. 4 in accordance with various embodiments of the present invention.

Turning to FIG. 6, one implementation of an auto scalar calculation circuit 500 is depicted that may be used in place of auto scalar calculation circuit 345 of FIG. 4 in accordance with various embodiments of the present invention. Auto scalar calculation circuit 500 includes a scaled soft output calculation circuit 595 that receives an input 501 (e.g., product output 337 of FIG. 4). Scaled soft output calculation circuit 595 calculates an absolute value of input 501, calculates a mean of the absolute values of input 501, and compares the mean against a threshold value 502 and another threshold value 503. In some embodiments, both threshold value 502 and threshold value 503 are programmable. The values of scaling factor 548 and scaling factor 549 are updated if either the mean of the absolute values of input 501 is less than threshold value 502 or if the mean is greater than threshold 503. The following pseudocode describes the update condition:

```
If (mean (|input 501|_i) < threshold 502 || mean (|input 501|_i) > threshold 503) {
        Update Scaling Factors
}
Else {
        Maintain Scaling Factors
}
```

Scaling factor 548 and scaling factor 549 are updated to assure that the mean of the absolute values of input 501 is maintained in a desired range controlled by threshold value 502 and threshold value 503.

Figure 7:
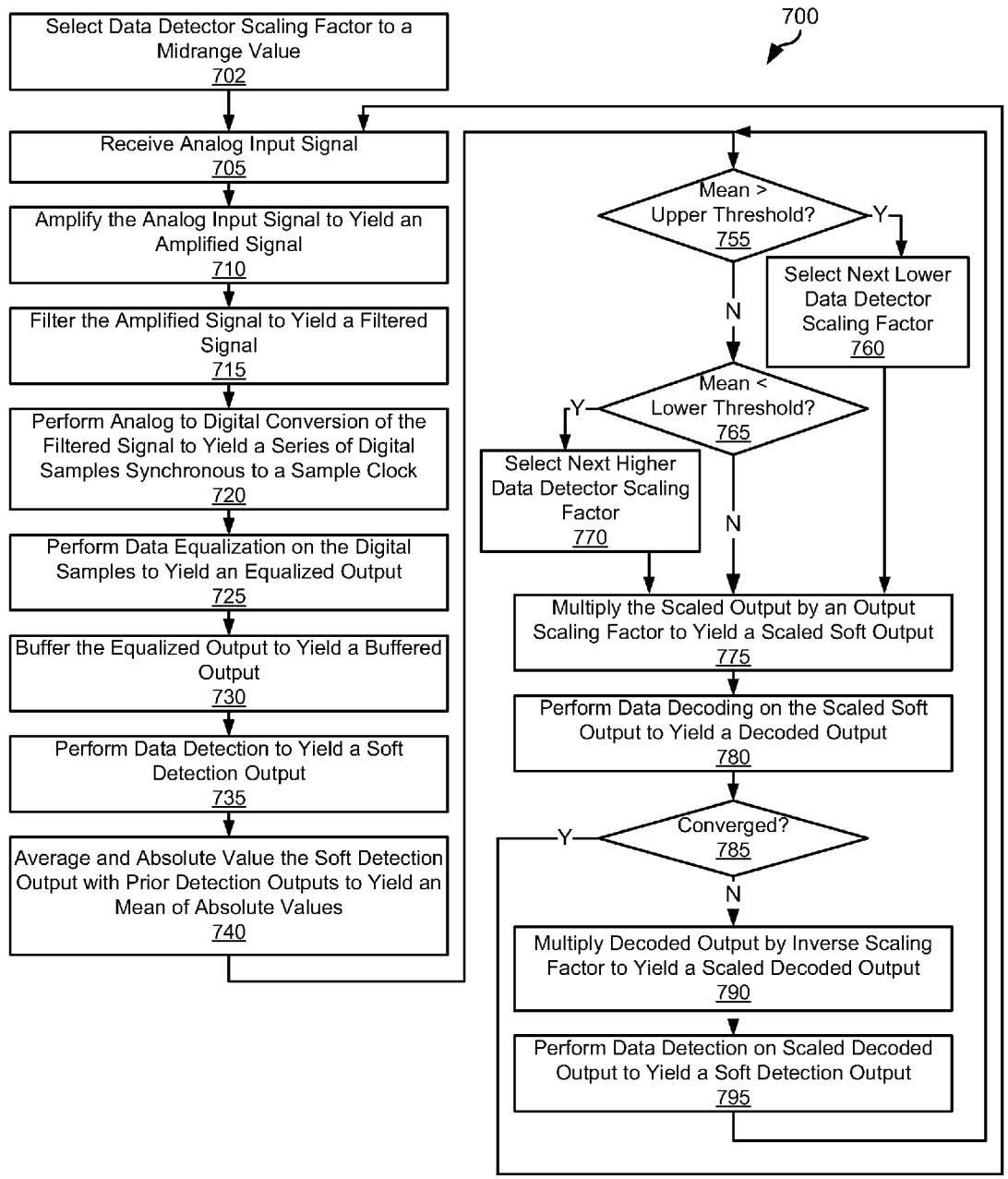
FIG. 7 is a flow diagram showing a method in accordance with various embodiments of the present invention for performing auto-scaled data processing.

Turning to FIG. 7, a flow diagram 799 depicts a method in accordance with various embodiments of the present invention for performing auto-scaled data processing. Following flow diagram 700, a data detector scaling factor is initialized to a midrange value (block 702). This may include, for example, setting the previously described data detector scaling factor 483 to a midrange value (e.g., ½, ¼, ⅛, ¹⁄₁₆ . . . ) by initial value selection circuit 485. An analog input signal is received (block 705). Analog input signal includes various information including one or more sync marks that are to be detected, and or one or more series of user data that are to be detected. Analog input signal may be received, for example, from a read/write head assembly that senses information from a storage medium or from a receiver that receives information from a transmission medium. Based upon the disclosure provided herein, one of ordinary skill in the art will recognize a variety of sources of the analog input signal. The analog input signal is amplified to yield an amplified signal (block 710), and the amplified signal is filtered to yield a filtered signal (block 715). The aforementioned amplification and filtering may be done in either order, and may be done by an analog front end circuit as are known in the art. An analog to digital conversion process is applied to the filtered output to yield a series of corresponding digital samples (block 720). The series of digital samples are synchronous to a sampling clock, and represent a value of the analog input signal at each particular sampling instant. Based upon the disclosure provided herein, one of ordinary skill in the art will recognize a variety of analog to digital conversion processes that may be applied in accordance with different embodiments of the present invention.

A data equalization process is applied to the digital samples to yield an equalized output (block 725). In some cases, the equalization process is performed using one or more digital finite impulse response filters as are known in the art. Based upon the disclosure provided herein, one of ordinary skill in the art will recognize a variety of data equalization processes that may be used in relation to different embodiments of the present invention. The equalized output is buffered for use in relation to multiple data detection and data decode processes (block 730).

A data detection process is performed on the buffered, equalized data to yield a soft detection output (block 735). Instances of the soft detection output are averaged together and an absolute value of the average taken to yield a mean of absolute values (block 740). The mean of the absolute values is compared against an upper threshold (block 755). Where it is greater than the upper threshold (block 755), the next lower data detector scaling factor is selected (e.g., η equal to ½, ¼, ⅛, or ¹⁄₁₆) (block 760). Alternatively, where the mean of the absolute values is not greater than the upper threshold (block 755), it is determined whether it is less than a lower threshold (block 765). Where it is less than the lower threshold (block 765), the next higher data detector scaling factor is selected (e.g., η equal to ½, ¼, ⅛, or ¹⁄₁₆) (block 770). Otherwise, where the mean of the absolute values is not less than the lower threshold (block 765), no changes are made to the data detector scaling factor.

Once the adjustments to the data detector scaling factor are completed, the internal branch metric (i.e., y-yideal)$^2$ is multiplied by the data detector scaling factor yields a scaled output. The scaled output is multiplied by an output scaling factor to yield a scaled soft output (block 775). This includes multiplying the scaled output (i.e., the output from the data detection process) by the output scaling factor (e.g., β2) to yield the scaled soft output. A data decoding process is applied to the scaled soft output to yield a decoded output (block 780). It is then determined whether the processing converged (block 785). Where the data processing has converged (block 785) the processing completes and the decoded output is provided as an output. Alternatively, where the data processing failed to converge (block 785), the decoded output is multiplied by an inverse scaling factor (e.g., $\alpha 2$) to yield a scaled decoded output (block 790). A data detection is performed on the scaled decoded output to yield a soft detection output (block 795). The processes of blocks 755 through 795 are repeated using the most recent updated absolute mean value.

The calculation and application of the aforementioned output scaling factor and the inverse scaling factor may be done in accordance with one or more of the methods disclosed in PCT Patent App. No. PCT/US09/41867 entitled "Systems and Methods for Dynamic Scaling in a Read Data Processing System", and filed Apr. 28, 2009 by Yang et al. The entirety of the aforementioned reference was previously incorporated herein by reference for all purposes. Based upon the disclosure provided herein, one of ordinary skill in the art will recognize other architectures into which an auto-scaled data detector circuit may be placed in accordance with different embodiments of the present invention.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for performing data processing and/or auto-scaling in a data processing system. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscriber line systems. Therefore, the above description should not be taken as limiting the scope of the invention, which is defined by the appended claims.

What is claimed is:

1. A data processing circuit, the circuit comprising:
a data detection circuit including:
a metric scaling circuit operable to scale a branch metric value by a first scaling factor to yield a scaled output;
a soft output calculation circuit operable to calculate a soft output based at least in part on the scaled output;
a factor calculation circuit operable to modify the scaling factor based at least in part on the soft output;
a soft output scaling circuit operable to scale the soft output by a second scaling factor to yield a scaled soft output;
a data decoding circuit operable to apply a data decoding algorithm to the scaled soft output to yield a decoded output; and
a decoded output scaling circuit operable to scale the decoded output by a third scaling factor to yield a scaled decoded output, wherein the third scaling factor is the inverse of the second scaling factor.

2. The data processing circuit of claim 1, wherein the data decoding circuit is a low density parity check circuit.

3. The data processing circuit of claim 1, wherein the data processing circuit further comprises:
a dynamic scalar calculation circuit operable to dynamically calculate the third scaling factor.

4. The data processing circuit of claim 1, wherein the metric scaling circuit is a multiplier circuit operable to multiply the branch metric value by the scaling factor to yield the scaled output.

5. The data processing circuit of claim 1, wherein the factor calculation circuit includes a scalar calculation circuit operable to calculate an absolute of a mean value including at least one instance of the soft output to yield a precursor value.

6. The data processing circuit of claim 5, wherein the factor calculation circuit further includes:
a comparator circuit operable to compare the precursor value against a threshold value, and to increment the scaling factor where the precursor factor is less than the threshold value.

7. The data processing circuit of claim 5, wherein the factor calculation circuit further includes:
a comparator circuit operable to compare the precursor value against a threshold value, and to decrement the scaling factor where the precursor factor is greater than the threshold value.

8. The data processing circuit of claim 5, wherein the factor calculation circuit further includes:
a selector circuit operable to select the scaling factor as one of a default scaling factor and a scaling factor based at least in part on the precursor value.

9. The data processing circuit of claim 1, wherein the data processing circuit is implemented in an integrated circuit device.

10. The data processing circuit of claim 1, wherein the data processing circuit is implemented as part of a storage device.

11. The data processing circuit of claim 1, wherein the data processing circuit is implemented as part of a data transmission device.

12. The data processing circuit of claim 1, wherein the data detection circuit implements a maximum a posteriori data detection algorithm.

13. A method for auto-scaling intrinsic processing values, the method comprising:
performing a data detection on a data input to yield a detected output, wherein the data detection yields a first interim value and a second interim value;
combining at least the first interim value and the second interim value to yield a precursor value;
comparing the precursor value with a threshold value to yield a comparison result;
modifying a first scaling factor based at least in part on the comparison result;
scaling the first interim value by the first scaling factor to yield a scaled interim value; and
generating a soft output corresponding to the scaled interim value, wherein the soft output is included in the detected output applying a data decoding algorithm to the scaled soft output using a data decoder circuit to yield a decoded output; and scaling the decoded output by a second scaling factor to yield a scaled decoded output, wherein the second scaling factor is the inverse of the second scaling factor.

14. The method of claim 13, the method further comprising:

dynamically calculating the second scaling factor using a dynamic scalar calculation circuit.

15. The method of claim 13, wherein scaling the first interim value by the first scaling factor to yield a scaled interim value is done using a multiplier circuit.

16. A storage device, the storage device comprising:

a storage medium maintaining information;

a read/write head assembly operable to sense the information and to provide a corresponding continuous signal;

an analog front end circuit operable to process the continuous signal to yield an analog input;

an analog to digital converter circuit operable to convert the analog input to yield a set of digital samples;

an equalizer circuit operable to equalize the digital samples to yield an equalized output; and a data detection circuit operable to perform a data detection on the equalized output to yield a detected output, wherein the data detection circuit includes:

a scaling circuit operable to scale a branch metric value by a scaling factor to yield a scaled output;

a soft output calculation circuit operable to calculate a soft output based at least in part on the scaled output, wherein the detected output includes the soft output; and a factor calculation circuit operable to modify the scaling factor based at least in part on the soft output, wherein the factor calculation circuit includes a scalar calculation circuit operable to calculate an absolute of a mean value including at least one instance of the soft output to yield a precursor value.

17. The storage device of claim 16, wherein the scaling factor is a first scaling factor, and wherein the storage device further comprises:

a soft output scaling circuit operable to scale the soft output by a second scaling factor to yield a scaled soft output;

a data decoding circuit operable to apply a data decoding algorithm to the scaled soft output to yield a decoded output; and a decoded output scaling circuit operable to scale the decoded output by a third scaling factor to yield a scaled decoded output, wherein the third scaling factor is the inverse of the second scaling factor.

18. The storage device of claim 17, wherein the storage device further comprises:

a dynamic scalar calculation circuit operable to dynamically calculate the third scaling factor.

19. The storage device of claim 16, wherein the factor calculation circuit comprises:

a scalar calculation circuit operable to calculate an absolute of a mean value including at least one instance of the soft output to yield a precursor value; and a comparator circuit operable to compare the precursor value against a threshold value, and to increment the scaling factor where the precursor factor is less than the threshold value.

20. The storage device of claim 16, wherein the factor calculation circuit comprises:

a scalar calculation circuit operable to calculate an absolute of a mean value including at least one instance of the soft output to yield a precursor value; and a comparator circuit operable to compare the precursor value against a threshold value, and to decrement the scaling factor where the precursor factor is greater than the threshold value.

* * * * *